United States Patent [19]

Lemke et al.

[11] 4,099,615

[45] Jul. 11, 1978

[54] CARRIER STRIP MOUNTED ELECTRICAL COMPONENTS

[75] Inventors: Timothy Allen Lemke, Dillsburg; Edmond Franklin Shultz, Jr., Hummelstown, both of Pa.

[73] Assignee: AMP, Incorporated, Harrisburg, Pa.

[21] Appl. No.: 661,678

[22] Filed: Feb. 26, 1976

Related U.S. Application Data

[63] Continuation of Ser. No. 499,719, Aug. 22, 1974, abandoned.

[51] Int. Cl.$^2$ ............................................. B65D 73/02
[52] U.S. Cl. ............................... 206/329; 339/276 SF
[58] Field of Search .................................. 206/328–330, 206/497, 484; 339/276 SF

[56] References Cited

U.S. PATENT DOCUMENTS

| 3,027,004 | 3/1962 | Gluck | 206/329 |
| 3,184,059 | 5/1965 | Kaplan | 206/329 |
| 3,256,982 | 6/1966 | Kisor | 206/329 |
| 3,608,711 | 9/1971 | Wiesler et al. | 206/330 |

Primary Examiner—Herbert F. Ross
Attorney, Agent, or Firm—Gerald K. Kita

[57] ABSTRACT

The invention relates to handling and assembling of miniature electrical components using a flexible carrier strip which serially arranges the components and provides an envelope enclosure protecting each of the components from contamination. The flexible carrier strip permits the serially arranged sockets to be reeled on a spool for storage. The sockets are then advantageously supplied to an insertion machine for assembly to a printed circuit board by indexing the flexible carrier strip repeatedly through the insertion machine.

4 Claims, 7 Drawing Figures

PRIOR ART

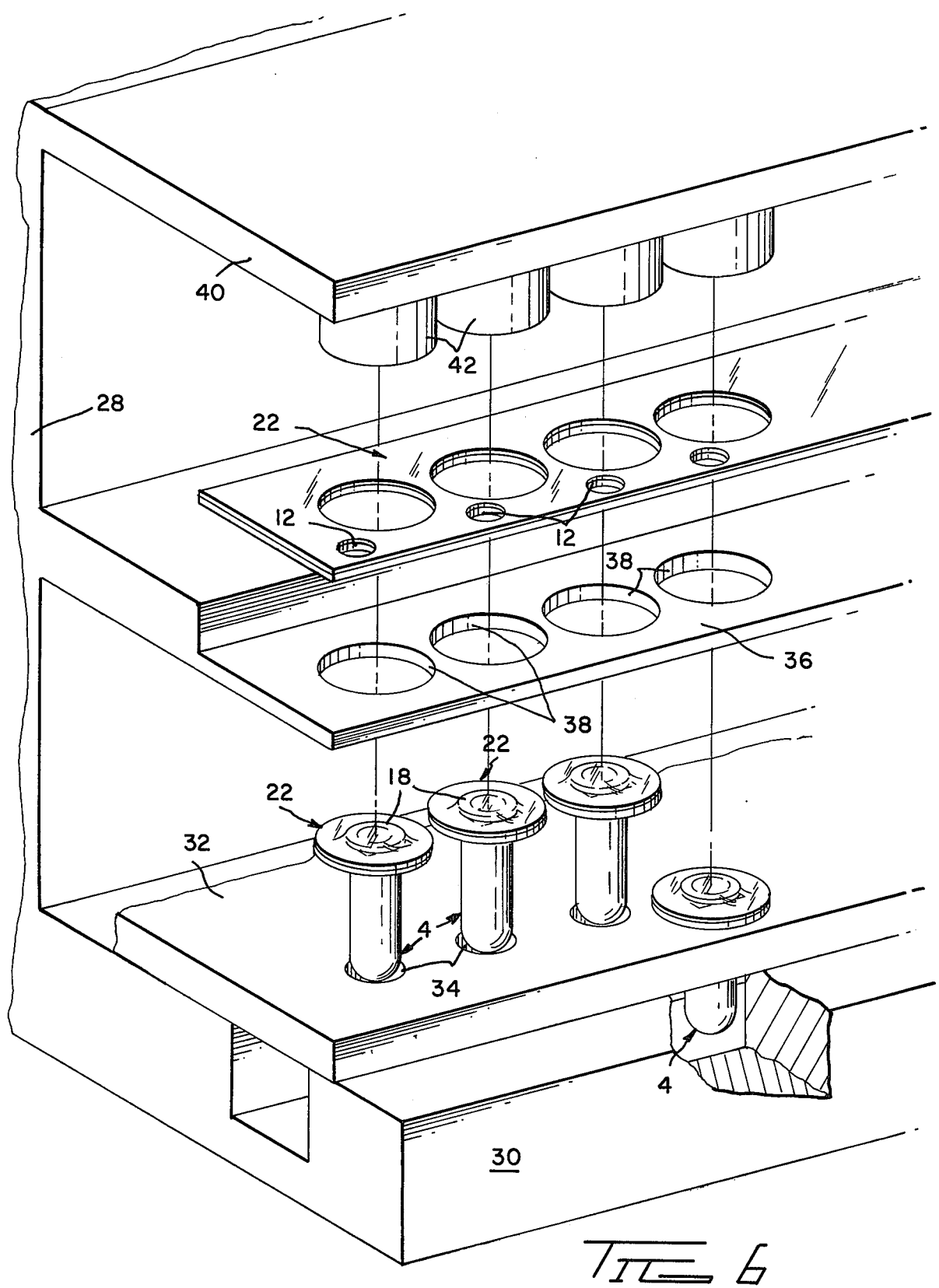

CARRIER STRIP MOUNTED ELECTRICAL COMPONENTS

This is a continuation of application Ser. No. 499,719, filed Aug. 22, 1974, now abandoned.

BACKGROUND OF THE PRIOR ART

It has been a practice in the prior art to pluggably mount a dual-in-line package into miniature electrical connections in the form of conducting resilient sockets mounted within apertures of a printed circuit board. The sockets are soldered in place within the printed circuit board and provide conducting receptacles for receiving the electrical leads of the dual-in-line package. The sockets are advantageously used for providing readily unpluggable electrical connections for the dual-in-line packages.

The sockets are required to be of very small size and are extremely difficult to handle and assemble to the printed circuit board. In addition the sockets readily trap contaminants which impair their operation as electrically conducting sockets. It is accordingly very difficult to solder the sockets in place and also to clean and further subject the printed circuit board to processing operations without contaminating the sockets.

BRIEF DESCRIPTION OF THE INVENTION

The present invention relates to a structure of and a method for arranging a plurality of sockets in serially spaced relationship along a carrier strip allowing ease in handling and ease in sequentially supplying the sockets to the insertion station of a machine utilized to assemble the sockets within corresponding apertures of a printed circuit board. Further the invention relates to a structure of and a method of fabricating a carrier strip which is of composite film construction and which forms an envelope over selected portions of the sockets to prevent them from contamination.

In the structure, sockets are inserted and seated in serially arranged apertures provided in a first web of flexible carrier strip material. A second web of flexible material forms a diaphragm which overlies the sockets. The second web is secure to the first web, thus forming an envelope covering at least portions of the sockets, leaving the remaining portions of the sockets projecting from the envelope for registration within corresponding apertures of a printed circuit board. Various techniques are disclosed to secure the webs together. The cooperating webs form a carrier strip which may be reeled up on a spool for storage. The carrier strip also is used for supplying sockets to an insertion station of an assembly machine when assembling the sockets into apertures of a printed circuit board. The envelope remains on the assembled sockets protecting them from contamination while the printed circuit board is subjected to processing operations, such as soldering the sockets in place and cleaning the printed circuit board with solvents and cleaning solutions. As a further feature of the present invention, individual sockets may be separated from the carrier strip by operation of the insertion machine, with a portion of the envelope around each of the separated sockets being severed from the carrier strip and remaining on the separated sockets. The separated sockets may then be inserted in a printed circuit board together with its own individual protective envelope also separated from the carrier strip together with the socket.

The envelope may be stripped off the socket or sockets when desired. Alternatively, the diaphragms overlying the sockets may be readily punctured by forcible insertion of the electrical leads of the DIP package into the sockets.

OBJECTS OF THE INVENTION

It is accordingly an object of the present invention to provide a composite web carrier strip for arranging miniature electrical circuit components in serial relationship.

It is another object of the present invention to provide a method of fabricating a composite carrier strip which provides a contaminant protective envelope over at least portions of a plurality of miniature circuit components mounted sequentially along the carrier strip.

Another object of the present invention is to provide a method for fabricating a composite carrier strip which provides a contaminant protective envelope over a plurality of miniature circuit components mounted serially along a carrier strip, wherein a selected portion of the protective envelope is readily separated from the carrier strip to remain in protective relationship over a selected miniature circuit component which itself is severed from the carrier strip and mounted on a printed circuit board.

It is another object of the present invention to provide a combination of a plurality of miniature circuit components mounted serially along a flexible carrier strip which provides a frangible protective envelope over each circuit element, whether the element remains on the carrier strip or is separated from the carrier strip for assembly in a printed circuit board.

Other objects and many attendant advantages of the present invention will become apparent upon perusal of the following detailed description taken in conjunction with the accompanying drawings.

DESCRIPTION OF THE DRAWINGS

FIG. 6 is a fragmentary enlarged schematic of an insertion machine which individually separates a selected socket from the carrier strip of FIG. 3 together with a portion of the carrier strip which remains on the individual separated sockets to form an individual contaminant protective envelope on one surface of the printed circuit board.

DETAILED DESCRIPTION

Figure 1:
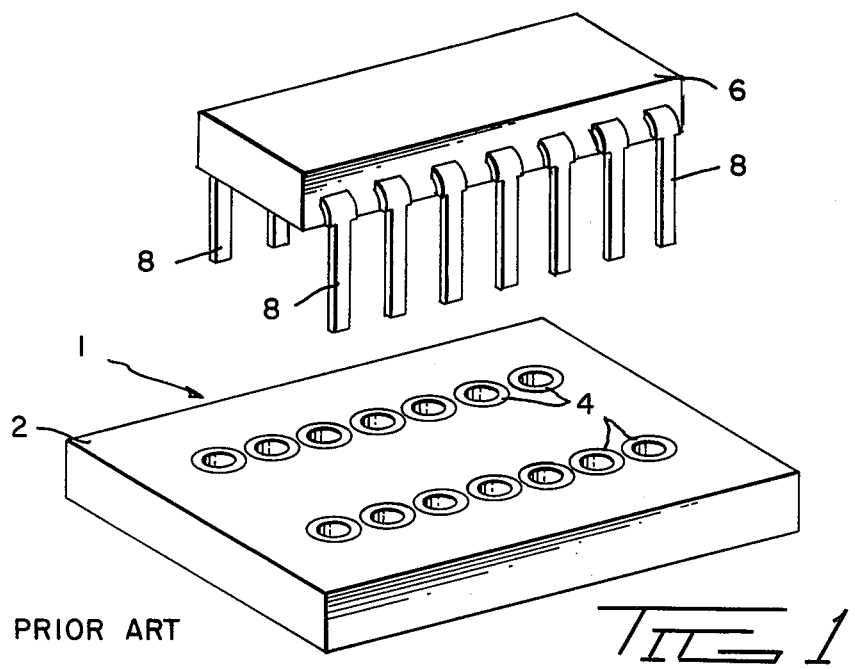
FIG. 1 is an enlarged fragmentary perspective with parts shown in exploded configuration to illustrate the details of the prior art.

With more particular reference to the drawings there is shown generally at 1 in FIG. 1 the combination of a printed circuit board 2 having apertures within which are mounted two rows of female receptacles in the form of conducting resilient sockets 4. An electronic circuit component in the form of a dual-in-line package 6 having depending electrical leads 8 arranged in two rows adapted for pluggable electrical connection within the sockets 4. The sockets advantageously allow for ease in terminating the leads 8 to the printed circuit board 2 without a need for soldering. Additionally the package 6 may be readily removed from the sockets 4 without the destruction thereof.

It has heretofore been difficult to assemble the sockets 4 to the printed circuit board and at the same time maintain the sockets 4 free of contaminants which impair the conductivity thereof. Because of their small size, the sockets 4 are difficult to handle and assemble within the apertures of the printed circuit board 2. In addition the printed circuit board is subjected to a plurality of processing operations, such as soldering the sockets 4 to the board 2 and cleaning the board 2 with solvents and various cleaning solutions. All of such process steps results in entrapment of contaminants within the sockets 4 impairing their operation.

According to the present invention there is devised a method and structure which initially mounts the sockets 4 in serial relationship along a flexible carrier strip permitting the sockets to be reeled up for storage and permitting the sockets to be sequentially fed by the carrier strip to an insertion station of an automatic assembly machine which inserts the sockets within the apertures of the printed circuit board 1. In addition, the carrier strip is of a construction having two cooperating films which provide an envelope enclosing the open ends of the serially mounted sockets.

Figure 2:
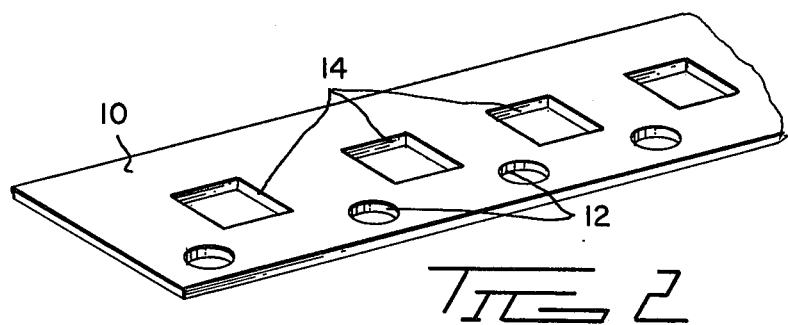
FIG. 2 is an enlarged fragmentary perspective illustrating a first film of a carrier strip according to the present invention.

As shown in FIG. 2 a first flexible web, strip or film 10 is in the form of an elongated ribbon or strip of plastic or other material suitable for reeling up on a spool for storage. The strip 10 includes spaced pilot holes 12 along one margin thereof which is a feature well-known for transport of the film by an indexing mechanism in an automatic machine. A plurality of apertures 14 are evenly spaced in serial relationship along the length of the film 10.

Figure 3:
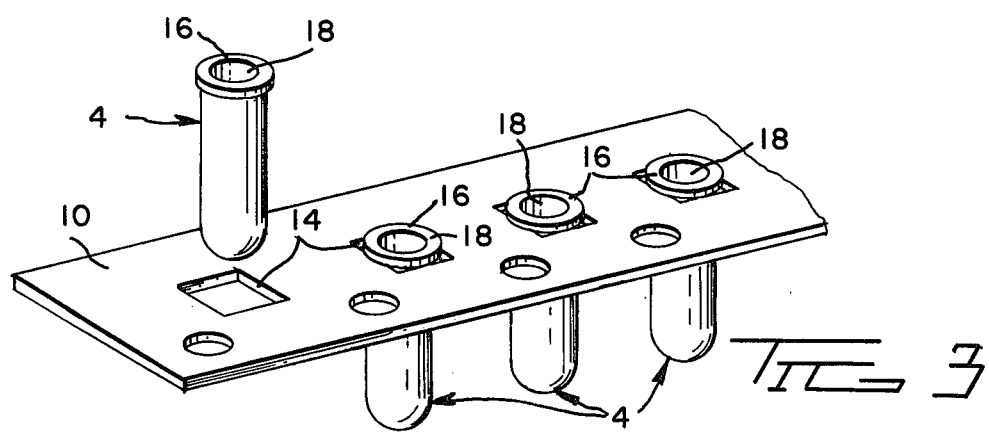
FIG. 3 is an enlarged fragmentary perspective with parts illustrated in exploded configuration and illustrating the assembly of a plurality of electrically conducting receptacles in the form of sockets mounted serially along the film illustrated in FIG. 2.

As shown in FIG. 3 the apertures 14 each receives therein one of the corresponding sockets 4. As in the usual practice, each socket 4 includes an annular enlarged lip 16 adjacent an open end 18. The lip 16 of each socket is seated against a surface of the film 10 which serially locates the sockets 4 in desired evenly spaced relationship. So as not to disturb the spacing, the film may be fabricated from a substantially nonstretchable material such as Mylar.

Figure 4:
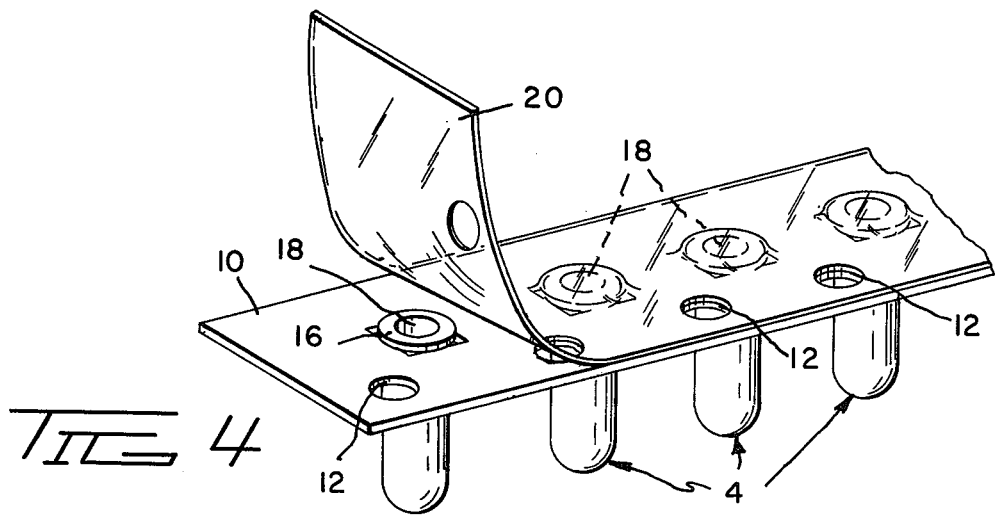
FIG. 4 is enlarged fragmentary perspective of a second flexible film forming a diaphragm over each of the sockets illustrated in FIG. 3, with the second film being secured to the first film to provide an envelope enclosing at least the open end portions of the sockets.
Figure 5:
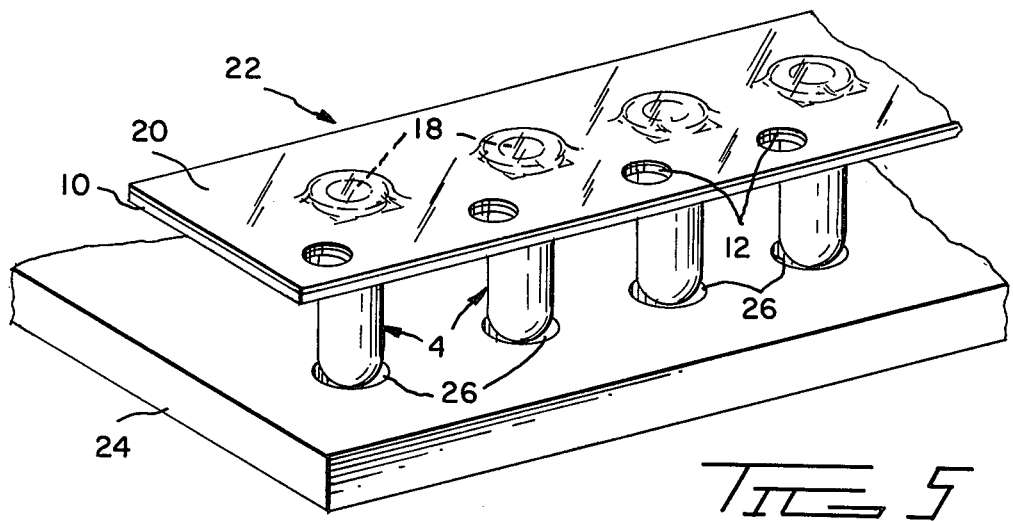
FIG. 5 is a fragmentary enlarged perspective with parts in exploded configuration to illustrate the use of the carrier strip composite component of FIG. 4 for aligning the sockets for insertion within the apertures of a printed circuit board.

As shown in FIG. 4 a second flexible web, strip or film 20 overlies the open end 18 of the sockets to provide a diaphragm covering the open ends 18 for protecting them from ingress of contaminants. The second film 20 is advantageously secured to the first film 10 by the technique of glueing, heat bonding, ultrasonic welding, adhesive bonding, stapling, folding together or any suitable securing technique. The second film 20 may be selected from any number of plastic materials which are sufficiently thin and flexible to form a frangible diaphragm covering the open ends 18 of the sockets 4. One advantageous selected film includes an adhesive coating thereon which is pressure sensitive for bonding the film 20 to the film 10. The film 20 when secured to the film 10 cooperates with the film 10 to provide an envelope enclosing at least the open end portions of the sockets 4. The remaining portions of the sockets 4 project from the envelope to allow for registration within or at least partial insertion within corresponding apertures of a printed circuit board. Both the film 20 and the film 10 are advantageously provided with aligned pilot holes 12 thereby forming a carrier strip as well as an envelope for the sockets 4. As shown in FIG. 5 the completed composite film carrier strip 22 is illustrated comprising the films 20 and 10 in secured relationship forming an envelope over the open end 18 of the sockets 4. The printed circuit board 24 includes a row of apertures 26 corresponding in spacing to the spacing of the sockets 4 along the carrier strip 22. The carrier strip aligns a plurality of the sockets 4 for insertion within the apertures 26, thereby eliminating the need for individually handling the sockets 4 and individually inserting them within corresponding apertures 26. The carrier strip 22 is designed to remain as an envelope over the open ends 18 while the sockets 4 are soldered in place within the printed circuit board apertures 26 and while the printed circuit board 24 is further processed to a completed manufactured device. Although only one row of sockets 4 is illustrated in FIG. 5, it is to be understood that two rows of sockets are required if they are used to provide pluggable connections for the leads 8 of the dual-in-line package 6 as shown in FIG. 1. In use, the second film 20 is a frangible diaphragm which is readily punctured when electrical leads such as the leads 8 are forcibly inserted into the open ends 18 of the sockets for pluggable connection thereto. In addition, the entire carrier strip comprised of the cooperating films 10 and 20 may be readily stripped away or otherwise removed prior to pluggable connection of the leads within the sockets 4.

Figure 7:
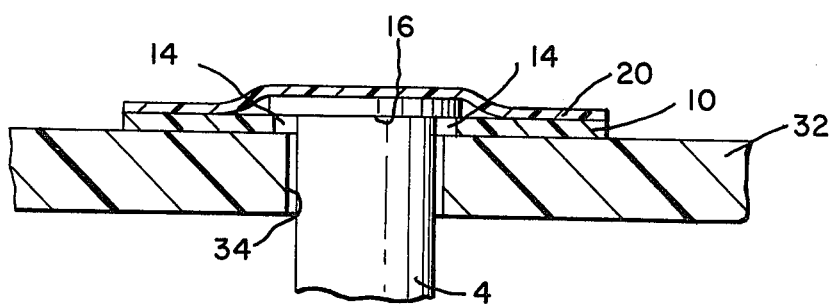
FIG. 7 is an enlarged fragmentary section illustrating the details of the composite carrier strip forming an envelope covering and protecting the open end of a socket.

As shown more particularly in FIGS. 4, 5 and 7, the apertures 14 of the first film 10 are generally of square configuration whereas the sockets for receipt therein are generally of circular cross-section. Such a structure provides openings or apertures around the periphery of the enlarged lips 16 of the sockets even though the socket lips are seated against the first film 10. Such apertures permit the application of a vacuum to the undersurface of the strip 10 tending to evacuate the clearance between the strip and the web or film by vacuum the second strip 20 into intimate contact with the top surface of the first strip 10 such that, ultrasonic welding, pressure bonding, heat bonding or otherwise securing the cooperating strips together may be accomplished while at the same time a tightly conforming diaphragm is formed which conforms to the shape of the open ends 18 of the sockets 4. The use of vacuum forming thus applies pressure between the cooperating films 10 and 20 and forcibly causes escapement of air between the films or webs when laminating without a need for applying pressure over the entire surface of the films and possibly forcibly pressing the enlarged rims or lips 16 of the socket through the apertures 14. However it is to be understood that such pressure over the film 20 may be utilized alternatively as desired to secure the films 20 and 10 together to form the carrier strip and envelope. The pilot holes 12 of the carrier strip may be engaged according to any well known automatic feeding mechanism for indexing the carrier strip and sockets to the insertion station of a press machine which presses and thereby assembles the sockets within the apertures 26.

In FIG. 6, there is shown schematically a machine 28 which includes an anvil 30 over which a printed circuit board 32 is placed. The printed circuit board has a plurality of apertures 34 in serial relationship. The machine 28 further includes a female die 36 having a plurality of apertures 38. The carrier strip 22 of FIG. 2 is indexed in the well known manner by an indexing mechanism to the insertion station of the machine 28. A male die 40 having a plurality of projecting punches 42 is forcibly vertically pressed through the carrier strip 22 thereby severing individual sockets 4 from the carrier strip 22. In addition the cooperating dies 36 and 40 blank out and remove selected portions of the carrier strip envelope from the remainder of the carrier strip 22. The selected blanked out envelope portions remain with the individually separated sockets 4, providing individual envelopes around corresponding sockets 4 and continuing to protect the open ends of the sockets 4 from ingress of contaminants. Accordingly individual sockets 4 may be severed from the carrier strip 22 together with selected portions of the envelope remaining to provide individual contaminant covers or envelopes for the open ends of the sockets. Each of the individual envelopes may be removed when desired or the diaphragm provided by the layer 20 may be readily punctured by the forcible insertion of electrical leads for electrical connection in the sockets 4.

As shown in FIG. 7 each socket 4 is adapted for soldering in place within a corresponding aperture 34 of the printed circuit board 32. When this is done, generally a solder wave applies solder to the undersurface 36 of the printed circuit board 32. The solder enters the clearance between the socket 4 and the sidewall of the corresponding aperture 34 to form a solder joint therebetween. The clearance spaces 14 in the first film 10 expose solder wettable first portions of the socket lip for contact by solder and permit solder to flow by capillary action along the projecting socket action into contact with the enlarged lip 16 further improving the solder connection of the socket 4 within the board 32. However the presence of the diaphragm 20 tightly in contact with solder wettable second portions of the socket lip prevent solder from entering the open end of the socket. In addition the clearance spaces 14 allow the escape of gasses from the aperture 34 into the spaces of the envelope around the socket lip 16 to relieve the build-up of pressure within the envelope and to allow such capillary action of the solder to occur.

Although preferred embodiments of the present invention are described in detail other modifications and embodiments are intended to be covered by the scope of the appended claims, wherein What is claimed is:

1. An assembly of electrical components, comprising:
   a carrier film provided with a plurality of spaced apertures,
   a plurality of electrical components received in said apertures and having solder wettable body portions projecting in depending relationship from said carrier film,
   a second film covering said carrier film and covering solder wettable first and second portions of each corresponding component,
   said second film and said carrier film cooperating to form envelope means enclosing said solder wettable first and second portions,
   said solder wettable body portions of corresponding components projecting externally of said envelope means,
   said apertures in said carrier film defining solder admissible clearance spaces adjacent said body portions to permit solder flow along said solder wettable body portions and through said carrier film and into said envelope means and into wettable contact with said first portions of said electrical components, and
   said second film contacting and covering said second portions of said electrical components within said envelope means preventing solder contact with said second portions while permitting solder contact with said first portions of said electrical components.

2. The structure as recited in claim 1, wherein, said carrier film and said second film are sealably adhered together where they contact each other, and said carrier film and said second film are severable around each of said components to divide said envelope means into individual envelopes enclosing selected components.

3. The structure as recited in claim 1, wherein, said solder wettable body portions are external surfaces of electrical sockets, said second solder wettable portions are projecting lips encircling openings of said sockets, and said first solder wettable portions are portions of said lips which are exposed by said clearance spaces for solder contact.

4. The structure as recited in claim 2, wherein, said solder wettable body portions are external surfaces of electrical sockets, said second solder wettable portions are lips surrounding openings to said sockets, and said first solder wettable portions are portions of said lips which are exposed by said clearance spaces for solder contact.

* * * * *